United States Patent [19]
Kim et al.

[11] Patent Number: 6,133,116
[45] Date of Patent: Oct. 17, 2000

[54] METHODS OF FORMING TRENCH ISOLATION REGIONS HAVING CONDUCTIVE SHIELDS THEREIN

[75] Inventors: Ki-Nam Kim; Jai-Hoon Sim; Jae-Gyu Lee, all of Kyunggi-do, Rep. of Korea

[73] Assignee: Samsung Electronics Co., Ltd., Rep. of Korea

[21] Appl. No.: 09/328,708

[22] Filed: Jun. 9, 1999

[30] Foreign Application Priority Data

Jun. 29, 1998 [KR] Rep. of Korea ............ 98-25174

[51] Int. Cl.[7] .................... H01L 21/76; H01L 21/8238
[52] U.S. Cl. ................ 438/430; 438/435; 438/221
[58] Field of Search .................. 438/424, 430, 438/431, 432, 433, 434, 454, 221, 218, 435

[56] References Cited

U.S. PATENT DOCUMENTS

| | | | |
|---|---|---|---|
| 4,833,098 | 5/1989 | Kato | 437/38 |
| 4,968,636 | 11/1990 | Sugawara | 437/24 |
| 5,003,372 | 3/1991 | Kim et al. | 357/53 |
| 5,059,550 | 10/1991 | Tateoka et al. | 437/67 |
| 5,233,215 | 8/1993 | Baliga | 257/490 |
| 5,557,135 | 9/1996 | Hashimoto | 257/308 |
| 5,597,765 | 1/1997 | Yilmaz et al. | 437/203 |
| 5,614,751 | 3/1997 | Yilmaz et al. | 257/394 |
| 5,776,817 | 7/1998 | Liang | 438/427 |
| 5,960,289 | 9/1999 | Tsui et al. | 438/275 |
| 5,966,598 | 10/1999 | Yamazaki | 438/221 |

FOREIGN PATENT DOCUMENTS

| | | |
|---|---|---|
| 0 159 483 | 10/1985 | European Pat. Off. |
| 0 382 865 | 8/1990 | European Pat. Off. |

OTHER PUBLICATIONS

Search Report, GB 9913674.9, Sep. 22, 1999.

*Primary Examiner*—Matthew Smith
*Assistant Examiner*—Lex H Malsawma
*Attorney, Agent, or Firm*—Myers Bigel Sibley & Sajovec

[57] ABSTRACT

Narrow-channel effect free DRAM cell transistor structure for submicron isolation pitch DRAMs having lowed-doped substrate and active width-independent threshold voltage by employing conductive shield in the shallow trench isolation (STI). The resulting cell transistor structure is highly immune to parasitic E-field penetration from the gate and neighbouring storage node junctions via STI and will be very appropriate for Gbit scale DRAM technology. The conductive shield is biased with the negative voltage in order to minimize the sidewall depletion in the substrate.

6 Claims, 17 Drawing Sheets

METHODS OF FORMING TRENCH ISOLATION REGIONS HAVING CONDUCTIVE SHIELDS THEREIN

BACKGROUND OF THE INVENTION

1. Field of the Invention

The present invention relates to a trench isolation and a method of forming thereof, and more particularly to a narrow-channel effect free transistor by employing a conductive shield embedded in the trench isolation.

2. Description of the Related Art

Integrated circuit fabrication usually requires that the individual active and passive circuit elements be electrically isolated form each other in the common semiconductor chip so that desired circuit connections can be made by patterned surface metallization with which the isolated circuit elements are in contact. Many diverse techniques have been proposed, ranging from junction isolation to dielectric isolation and to combinations thereof, to accomplish the desired isolation.

As device dimensions get smaller, and device density increases, it becomes more and more difficult to build an efficient and reliable isolation process to separate active devices. The limits of the standard LOCOS process have motivated the search for and the development of new isolation schemes, and trench isolation is a promising candidate as it uses a fully recessed oxide, has no bird's beaks, is fully planar, and does not suffer from the field oxide thinning effect.

As the integration level of semiconductor memory devices increases, the integration level is progressing to a DRAM device having a size of a Gbit or more. Since components of a Gbit unit device are scaled down to less than 0.20 micrometers(i.e., 0.1 micrometers of minimum feature size), the likelihood that problems associated with channel width of the transistor may occur increases greatly.

Since DRAM cell transistor requires a threshold voltage of at least 1V or more independent of the DRAM density and operation voltage, the channel doping density must increase significantly in order to offset decrease in the threshold voltage caused by the scaling down of transistor dimension. FIG. 1 schematically shows the relationship between the gate length, doping density and the degree of memory device density. As can be seen in FIG. 1, if the channel length of the transistor is about 0.1 micrometers, it is required that the substrate doping density be at least $2 \times 10^{18}/cm^{-3}$ in order to adjust threshold voltage of the transistor at a level of about 1V. If the channel length decreases furthermore, the substrate doping density must be increased. Such increase in the substrate doping density causes undesirable side-effects as follows.

The cell transistor suffers form increased junction leakage current due to high substrate doping, and serous threshold voltage variation caused by active width CD variation and enhanced narrow-channel effect. The breakdown voltage significantly decreases due to a tunnelling phenomenon and thereby increasing leakage current of a storage node. High substrate doping density increases junction capacitance and thereby increasing parasitic capacitance and increases depletion capacitance.

Even more, when the isolation pitch is scaled down to less than 0.2 micrometers, serous threshold voltage fluctuation will be induced by the neighbouring drain E-field penetration effect. Namely, when the shallow trench isolation space is scaled down to less than 0.1 micrometers, the drain/source E-field penetration into the sidewall depletion region from the neighbouring cell transistors will increase. The drain/source E-field penetration will result in the barrier lowering near the center of the active cell transistor channel, and the threshold voltage will fluctuate depending on the junction voltages of the neighbouring cell transistors. So, threshold voltage of the DRAM cell transistors becomes difficult to be scaled down as the operation voltage decreases owing to increased threshold voltage variation. For the low voltage operation DRAMs, unscalable threshold voltage will seriously impact the DRAM speed performance of $t_{RAC}$ and $t_{RCD}$ due to degraded saturation current. Therefore, in order to satisfy the tight electrical requirement for low voltage/power and high speed operation, threshold voltage should be scaled down while minimizing its variation caused by active width DC variation and narrow channel effect.

SUMMARY OF THE INVENTION

The present invention was made in view of above-mentioned problems and is directed toward providing a narrow-channel effect free cell transistor structure having low-doped substrate and active width-independent threshold voltage and a method for fabricating thereof by employing conductive shield in the shallow trench isolation. The resulting cell transistor structure is highly immune to parasitic E-field penetration from the gate and neighbouring storage node junction via the shallow trench isolation and will be very appropriate for Gbit scale DRAM technology.

A feature of the present invention is the formation of the shallow trench isolation having an embedded conductive shield therein, and the conductive shield in the shallow trench isolation is electrically connected to a power supply line through a contact in an interlayer insulating layer. The conductive shield is biased with negative voltage or Vss in order to minimize the sidewall depletion, and narrow channel effect caused by parasitic gate-to-substrate sidewall capacitance disappears. Once the narrow channel effect disappears, threshold voltage becomes independent of the active width CD variation, and the substrate doping can be lowered.

These and other features are provided, according to the present invention, by a semiconductor device comprising a trench isolation formed in a semiconductor substrate and being made of an inner embedded-conductive shield and an outer insulator, the outer insulator formed on a bottom sidewalls and a top portion of the trench to encapsulate the shield and the trench isolation surrounding the substrate to define an active region, a transistor formed on the active region, an interlayer insulating layer, and a power supply line formed on the interlayer insulating layer and electrically connected to the embedded-connective shield through a contact in the interlayer insulating layer and the insulator.

These and other features are provided, according to the present invention, by forming a trench isolation in a semiconductor substrate, the trench isolation having an embedded-conductive shield therein and surrounding a pre-determined portion of the semiconductor substrate and defining an active region, forming a transistor on the active region, forming an interlayer insulating layer, and forming a power supply line on the interlayer insulating layer to be electrically connected to the embedded-conductive shield of the trench isolation so as to control a threshold voltage of the transistor.

The trench isolation is formed by etching the semiconductor substrate to form a trench therein, the trench defining a bottom and sidewalls, growing a thermal oxide layer on the bottom and sidewalls, completely filling the trench with a conductive material, etching the conductive material to recess at a predetermined depth from a top surface of the semiconductor substrate, filling the recessed portion with an insulator to form the embedded-conductive shield and thereby forming the trench isolation. The method further comprises, prior to the formation of the insulator, forming a material layer that has an etching selectivity with respect to the insulator so as to protect the conductive material. Filling the recessed portion can be carried out by depositing an oxide layer. Alternatively, the recess portion can be filled by growing an oxide layer.

More specifically, the conductive shield in the trench is made of a polysilicon, a metal or a silicide thereof. The conductive shield is supplied with negative bias voltage or Vss to remove the narrow channel effect of the transistor. The insulating layer is made of an oxide and the material layer is made of a nitride. The insulator comprises an oxide of $O_3$_TEOS(tetraethylorthosilicate), HDP(high density plasma) and SA(sub-atmosphere) CVD.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

Figure 1:
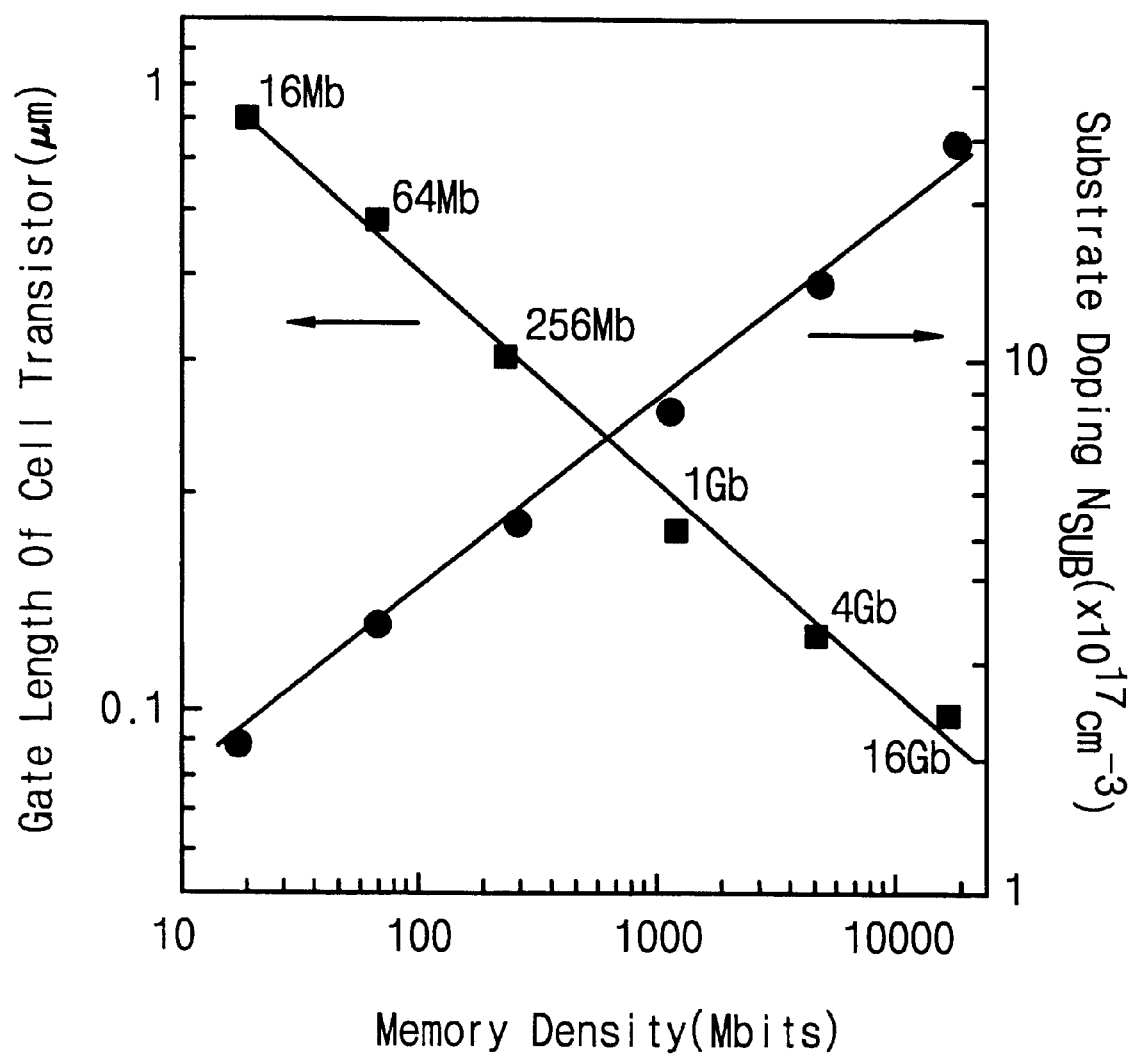
FIG. 1 shows schematically the relationship between the gate length, doping density and the degree of memory device density.
Figure 2:
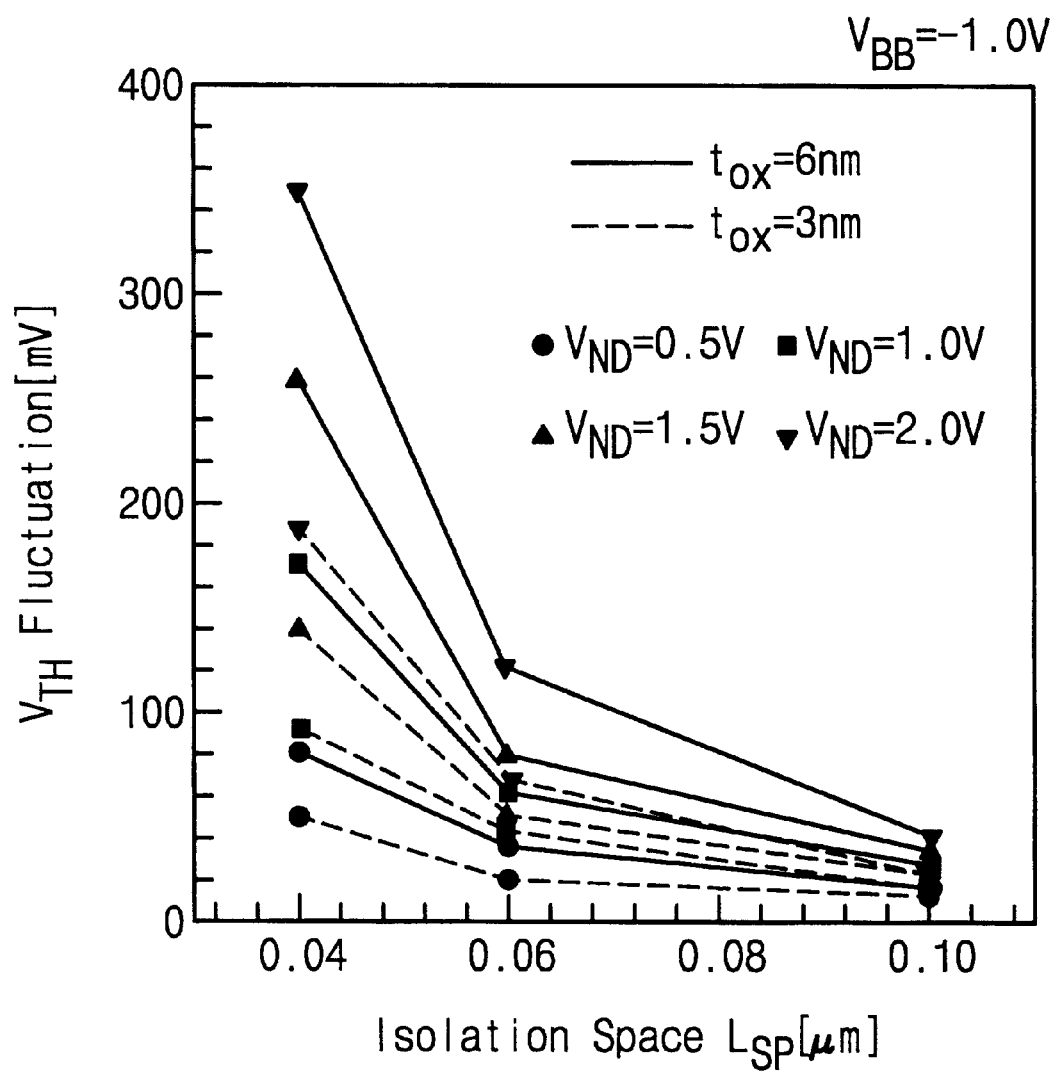
FIG. 2 shows schematically the relationship between the threshold voltage fluctuation and isolation space for various $V_{ND}$(junction voltage of the storage node) with gate oxide thickness of 6 nm and 3 nm.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present. Moreover, each embodiment described and illustrated herein includes its complementary conductivity type embodiment as well.

Figure 3:
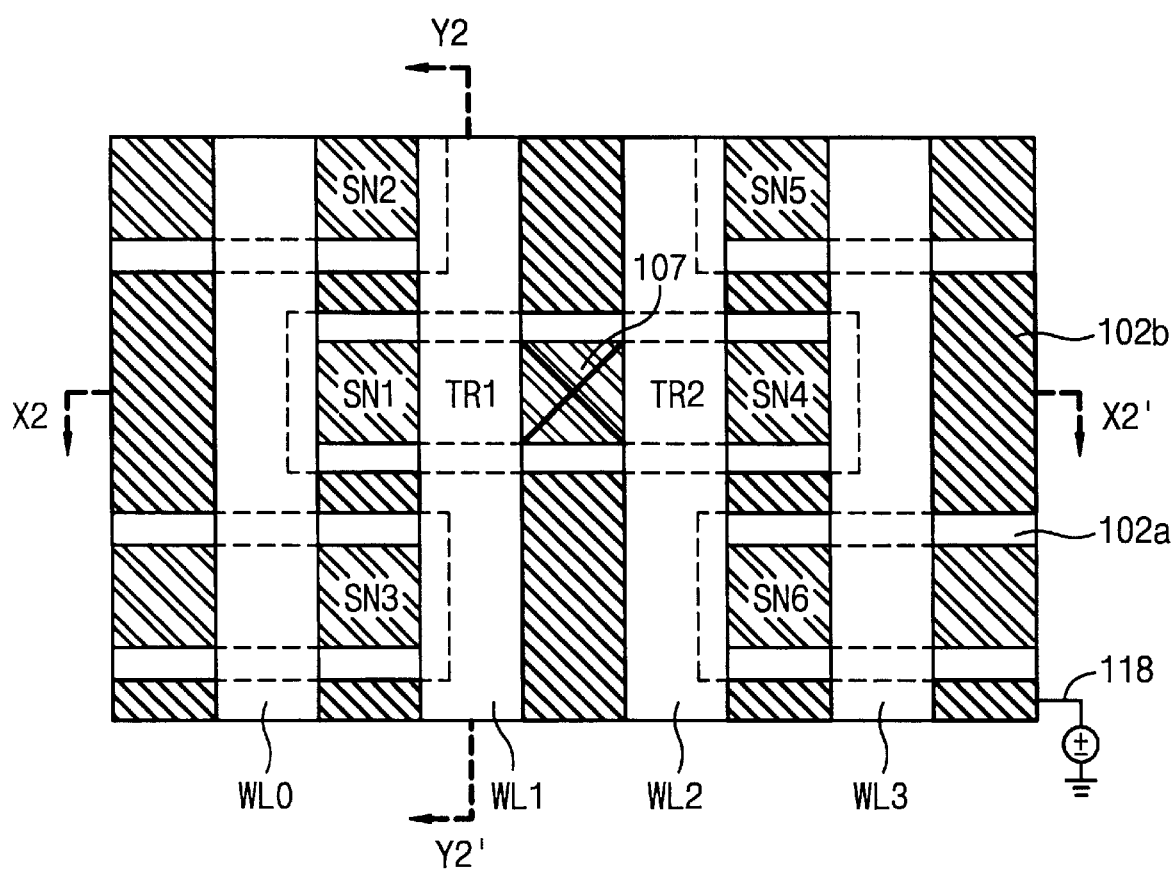
FIG. 3 shows a schematic diagram to block the neighbouring electric field penetration effect from storage nodes 2 and 3 onto transistor 1 by shield plane in accordance with the present invention.
Figure 4:
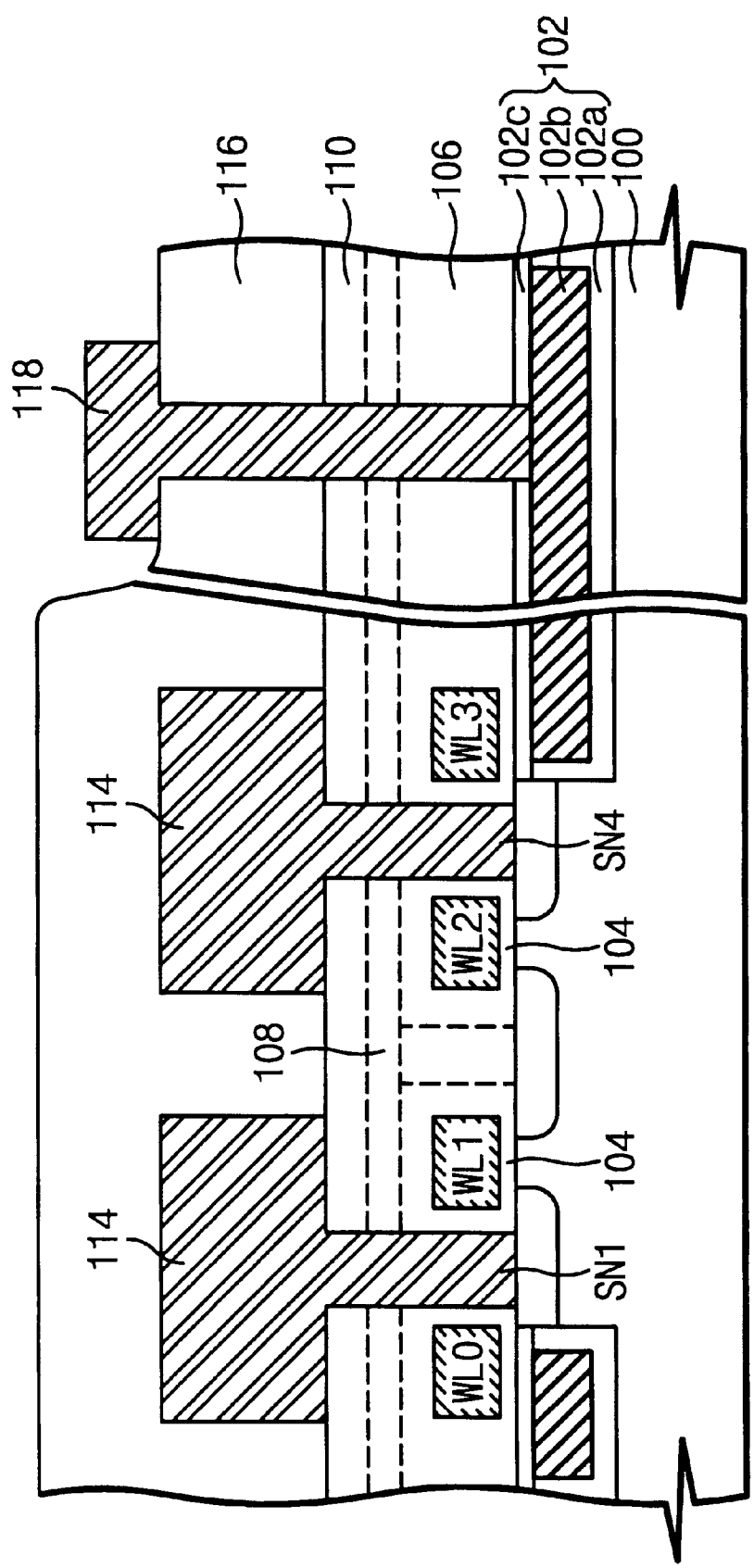
FIG. 4 shows a cross-sectional view taken along line X2–X2' of FIG. 3.
Figure 5:
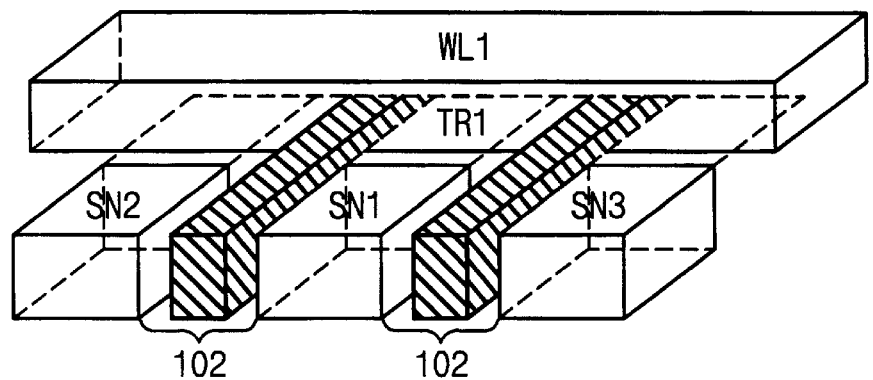
FIG. 5 shows a cross-sectional view taken along line Y2–Y2' of FIG. 3.

The present invention provides a trench isolation which can allow a narrow-channel effect free DRAM cell transistor structure for sub-0.2 micronmeters isolation pitch DRAMs and a method for fabricating thereof. FIG. 3 shows the schematic diagram of the cell transistor with conductive shield inside the shallow trench isolation in accordance with the present invention. FIG. 4 and FIG. 5 are cross-sectional views taken along lines X2–X2' and Y2–Y2' of FIG. 3, respectively.

The conductive shield 102b and the substrate are separated by thermally grown thin oxide layer 102a. The top portion of the conductive shield 102b is covered by an insulator 102c for electrical separation later-formed layers. Five active areas are shown in FIG. 3 and surrounded by the shallow trench isolation 102 with the embedded conductive shield 102b therein. Seen from top, the conductive shield 102b resembles mesh type plane. The conductive shield 102b is electrically connected to a power supply line 118 in order to minimize sidewall depletion in the substrate. A plurality of storage nodes, for example, SN 1–6 is formed to be electrically connected to the predetermined active regions lateral to the transistors. A plurality of word lines, for example, WL0–WL3 are formed to intersect the active regions. Bit lines 108 are also formed to be electrically connected to the predetermined active region through the bit line contact 107.

The conductive shield 102b is made of a conductive material that is stable at high temperature and has an etching selectivity with respect to a nitride, for example, a doped polysilicon and a metal. In order to adjust threshold voltage, potential is supplied to the conductive shield 102b through the power supply line 118. If the conductive shield 102b is made of n-type polysilicon, Vss or Vbb(back bias voltage) is supplied thereto. Any potential less than Vss, i.e., negative potential can be also supplied. If the conductive shield 102b is made of p-type polysilicon, positive potential is supplied.

Figure 6:
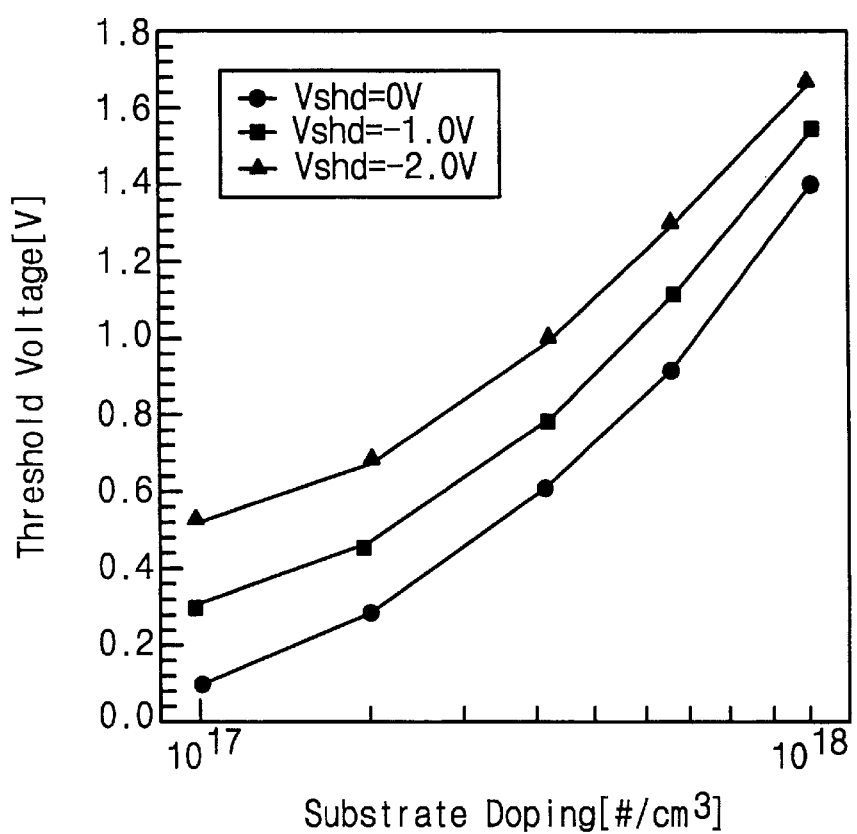
FIG. 6 shows schematically the relationship between the threshold voltage of the cell transistor and substrate doping density with various conductive shield potential.

When the threshold voltage is adjusted by $V_{shd}$(potential supplied to the conductive shield) in accordance with the present invention, the silicon substrate can be biased with ground instead of conventional $V_{BB}$(substrate back bias : which is generally supplied to the substrate in DRAM technology to adjust the threshold voltage). Accordingly, there is no need to form a triple well. FIG. 6 shows schematically the relationship between the threshold voltage of the cell transistor and substrate doping density with various conductive shield potential.

Figure 7:
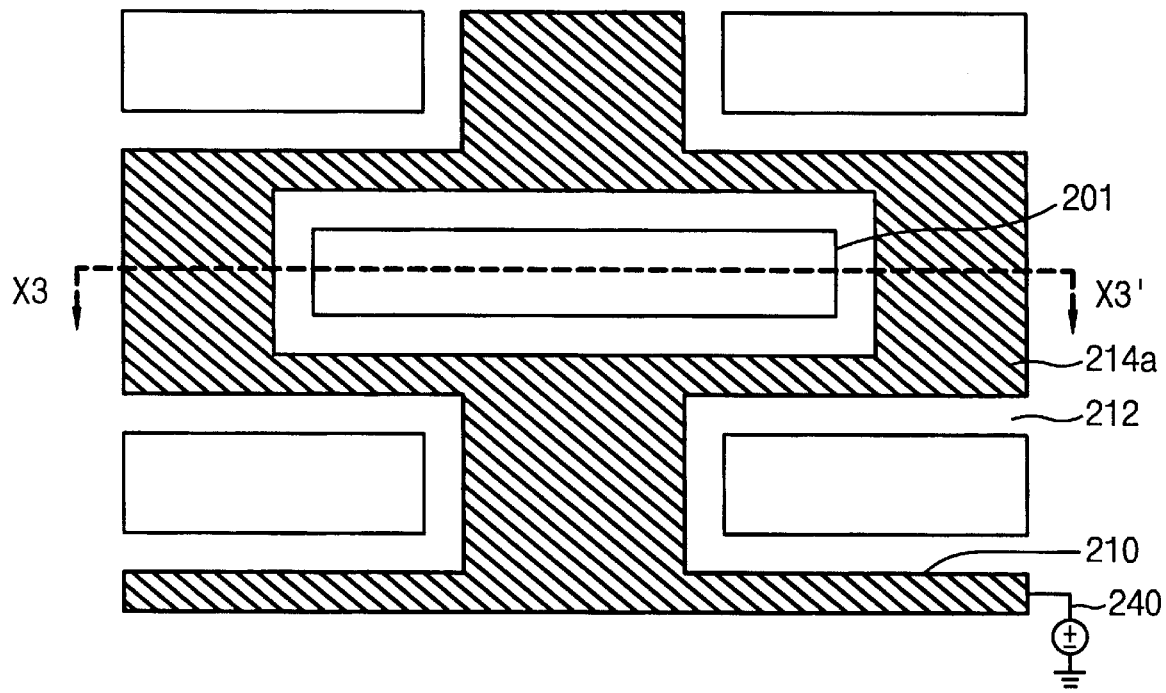
FIG. 7 shows a schematic diagram of the cell transistor structure with conductive shield inside the shallow trench isolation according to the present invention.

The formation of the narrow-channel effect free cell transistor in accordance the present invention will now be described in detail hereinafter. FIG. 7 shows a schematic diagram of the cell transistor structure with a conductive shield inside the shallow trench isolation according to the present invention. The active region 201 is electrically separated from each other by a shallow trench isolation 210 which is made of a thermal oxide layer 212 on the sidewalls and bottom of the trench 210, a conductive shield 214a form on the thermal oxide layer 212 and buried in the trench 210 with an insulator(now shown) thereon to cover a top portion of the conductive shield 214a. FIGS. 8A to 8I are cross-sectional views taken along line X3–X3' of FIG. 7, at selected process steps of forming a semiconductor memory device according to a first embodiment of the present invention.

First, active region is defined using oxide-SiN-oxide layer followed by the trench etch into the substrate. The trench is filled with a conductive material such as a doped polysilicon or metal that is used as the conductive shield after thermal oxidation process. Then the doped poly above the stopping layer SiN is removed by chemical mechanical polishing (CMP). After SiN removal step, the gate oxide layer grown above the silicon surface and then followed by conventional DRAM process.

Figure 8A:
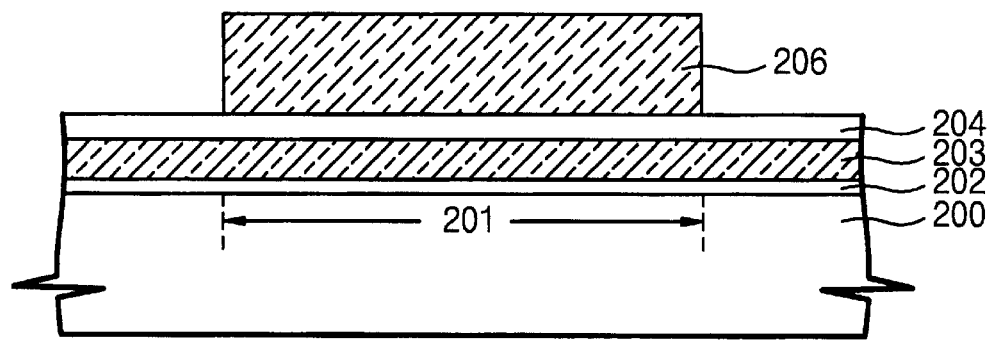
FIGS. 8A to 8J are cross-sectional views taken along line X3–X3' of FIG. 7, at selected process steps of forming a semiconductor memory device according to a first embodiment of the present invention.
Figure 8B:
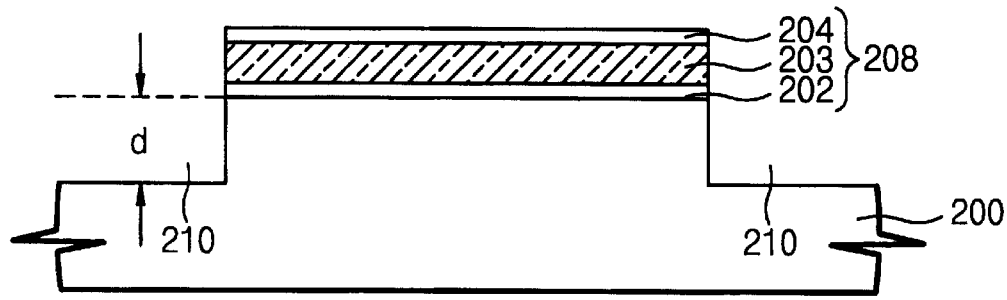

More particularly, referring to FIG. 8A, a pad oxide layer 202, a silicon nitride layer 203 and a masking oxide layer 204 are sequentially formed on the semiconductor substrate 200 by conventional depositing technique such as chemical vapor deposition(CVD). A photoresist pattern 206 is formed on the masking oxide layer 204 to define the active region 201. Using the photoresist pattern 206, the deposited layers 204, 203 and 202 are etched to form an etching mask 208 as shown in FIG. 8B. Using this etching mask 208, the exposed substrate 200 is etched down to a predetermined depth of dimension "d" to form a trench 210. The depth of the trench is at least the depth of later-formed source/drain junction.

Figure 8C:
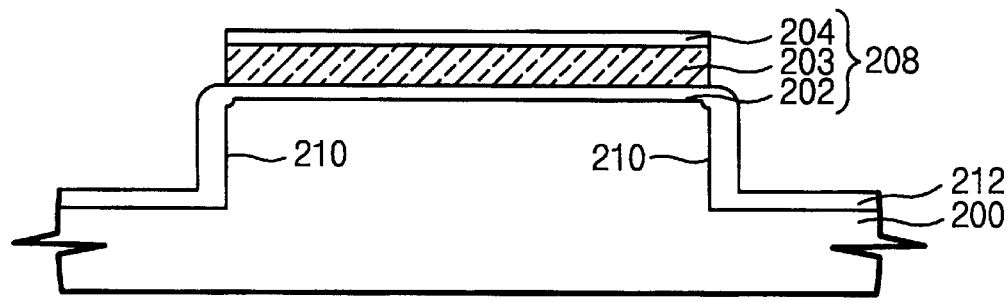

Referring now to FIG. 8C, after cleaning the trench, a thermal oxidation process is carried out on the interior trench so as to remove substrate damage caused by aforementioned etching process. Through the thermal oxidation process, a thermal oxide layer 212 is grown on the interior trench.

Figure 8D:
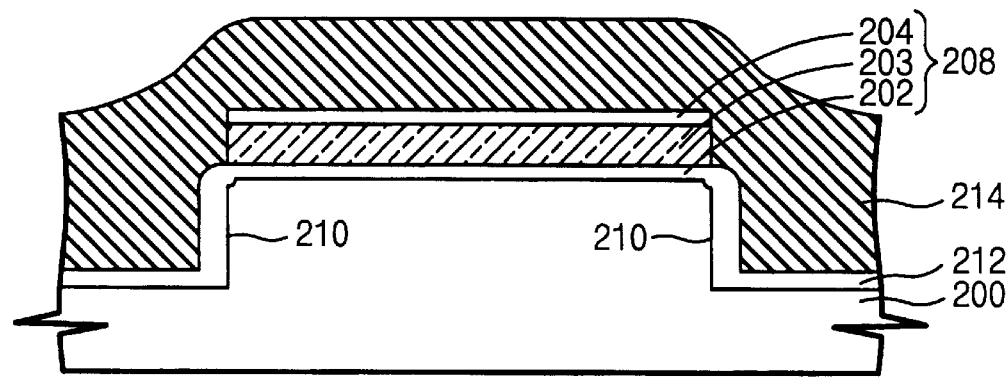

Referring now to FIG. 8D, a conductive material 214 that has a good etching selectivity with respect to a silicon nitride layer 203 and is stable at a high temperature is deposited over the entire surface of the substrate 200 to completely fill the trench 210. For example, a doped polysilicon, a metal or a silicide thereof can be used.

Figure 8E:
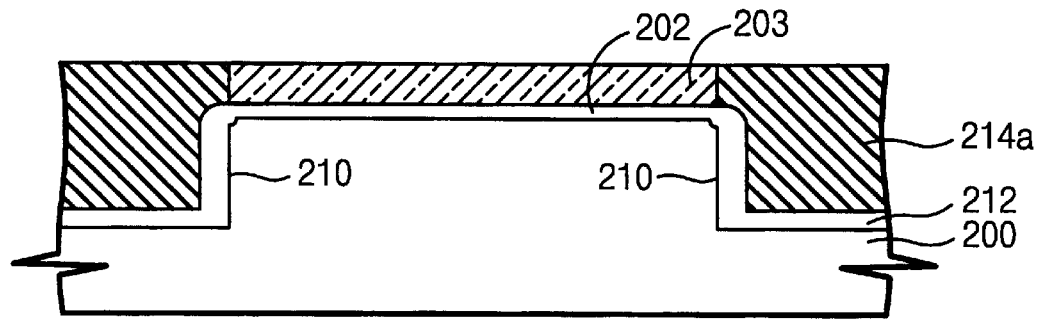
Figure 8F:
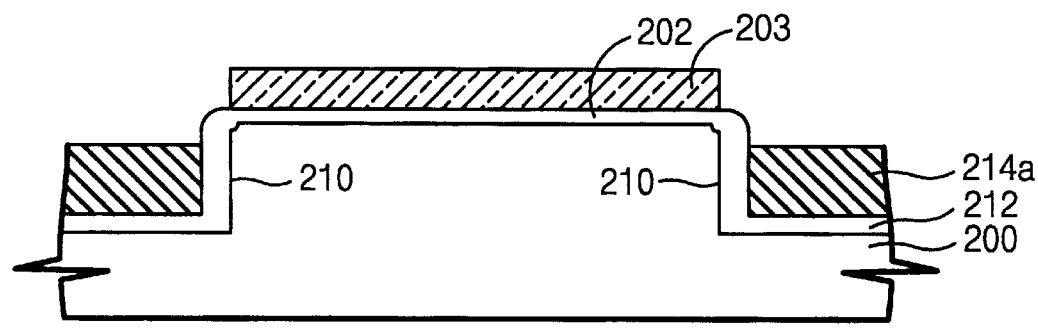

Planarization process such as CMP is carried out down to the silicon nitride layer 203 as shown in FIG. 8E to form the conductive shield 214a. This conductive shield 214a is supplied with Vbb or Vss through the later-formed power supply line 240 in order to adjust threshold voltage of the transistor. Subsequently, etch back process is carried out to recess the conductive shield 214a at a predetermined depth from a top surface of the substrate 200 at the active region 201. The etch back process is carried out to have an etching selectivity with respect to the silicon nitride layer 203.

Figure 8G:
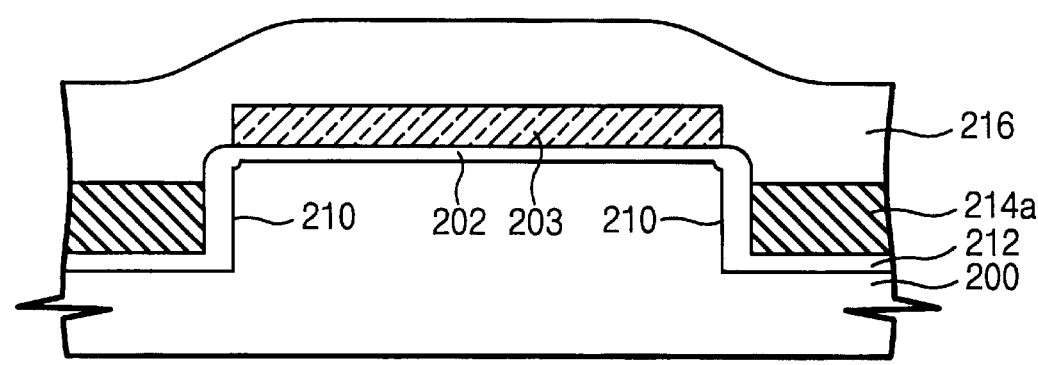
Figure 8H:
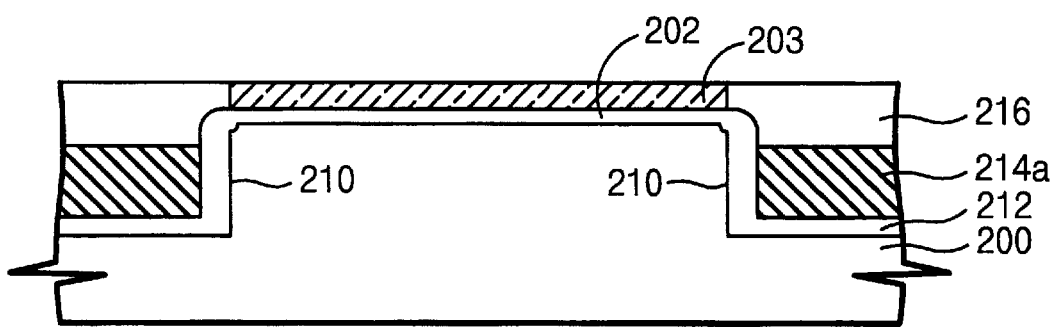
Figure 8I:
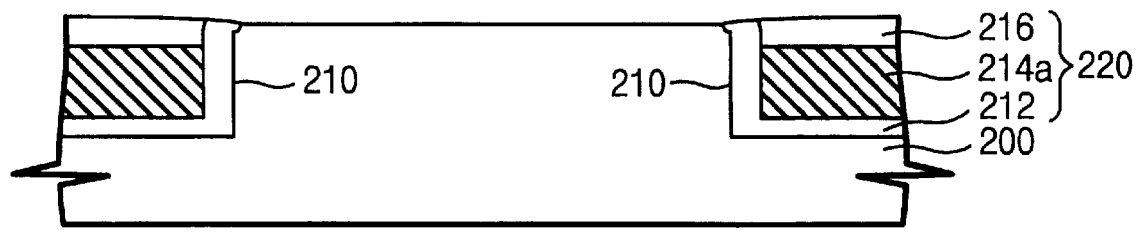
Figure 8J:
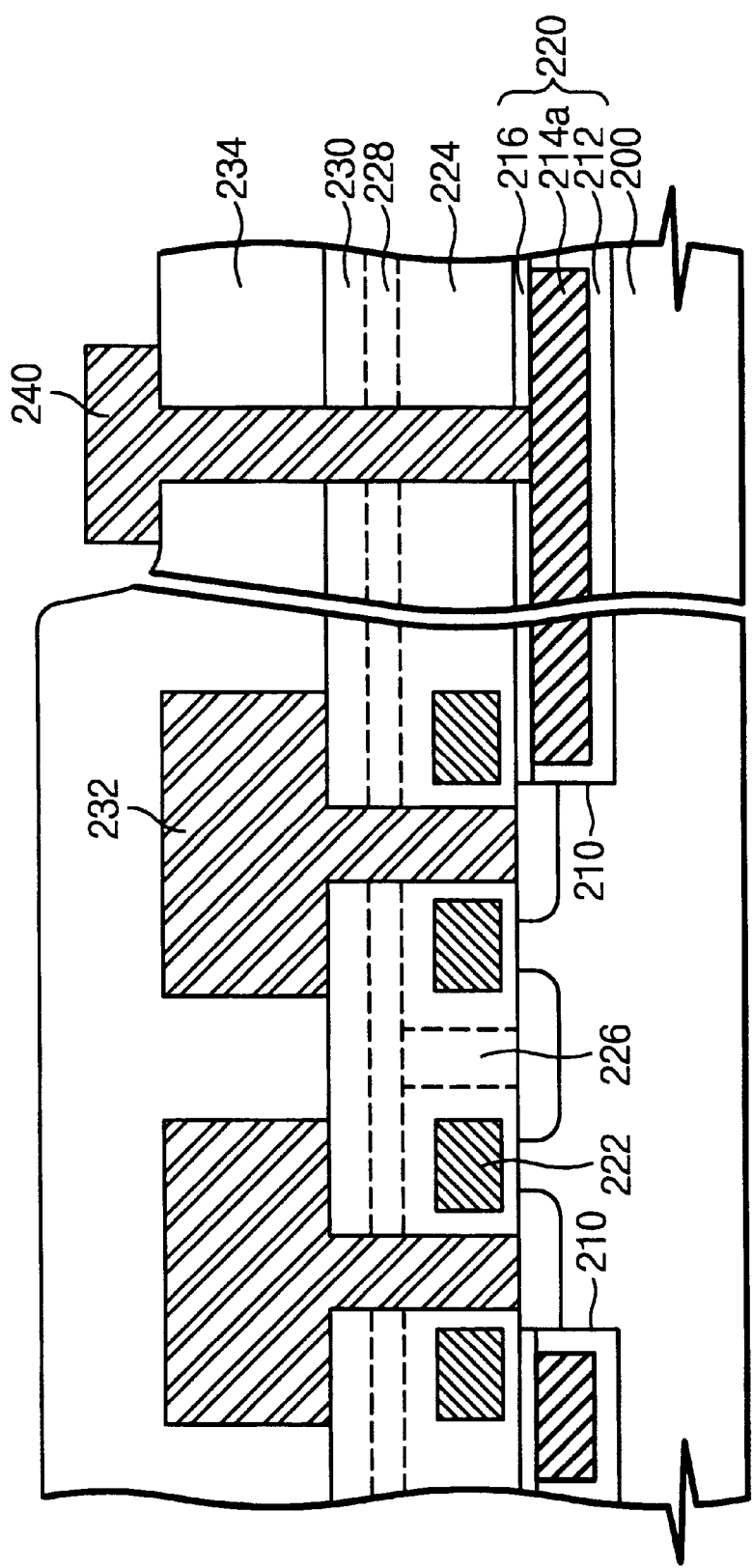

In order to complete the trench isolation, an insulator 216 conventionally used in the trench isolation is deposited to fill the recessed portions as shown in FIG. 8G. The insulator, for example, is made of an oxide selected from the group consisting of an oxide of $O_3$-TEOS(tetraethylorthosilicate), HDP(high density plasma) and SA(sub-atmosphere) CVD. Since already conductive material 214a is deposited in the trench, the insulator 216 exhibits a good filling characteristic. Finally, planarization process is carried out to complete trench isolation having an embedded conductive shield 214a as shown in FIG. 8H.

Next, a gate oxide is formed and impurity conventional ions implantation for adjusting threshold voltage is carried out. A transistor is formed through a conventional technique. After that, a first interlayer insulating layer 224 is deposited on the resulting structure. A bit line 228 is then formed on the first interlayer insulating layer 224 and electrically connected to the desired active region. A second interlayer insulating layer 230 is deposited on the bit line 228 and on the first interlayer insulating layer 224. Through a conventional technique, a capacitor 232 is formed on the second interlayer insulating layer 230 to be electrically connected to the desired "active region of the substrate. Though not shown, the capacitor 232 is made of a storage node, a dielectric film and a plate node. A third interlayer insulating layer 234 is deposited on the capacitor 232 and on the second interlayer insulating layer 230. A power supply line 240 is then formed on the third interlayer insulating layer 234 to be electrically connected to the conductive shield 214a of the trench isolation 220.

Figure 11A:
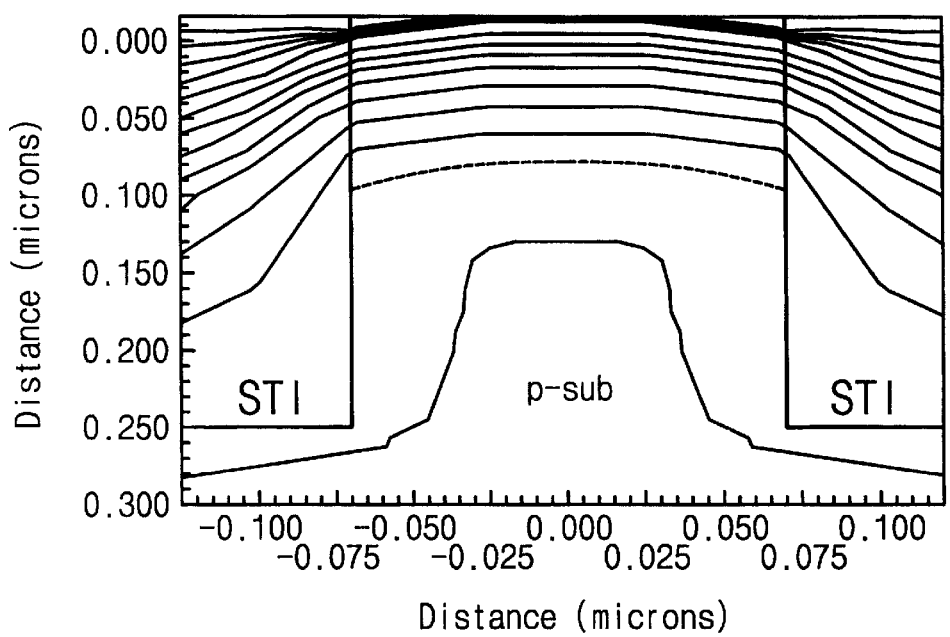
FIGS. 11A and 11B schematically show potential profiles of the cell transistors biased at $V_G$=0.0V and $V_{BB}$(substrate back bias voltage)=-1.0V using 3D device simulation, respectively showing conventional and the present invention.
Figure 11B:
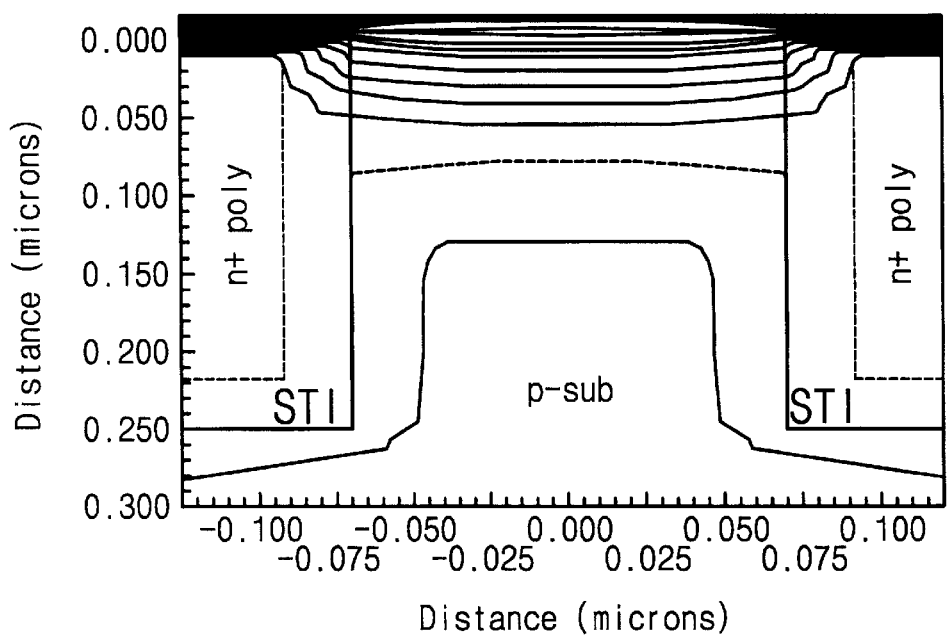

In order to minimize the sidewall depletion in the substrate, the threshold voltage can be adjusted by supplying a bias voltage with the conductive shield 214a. For example, the n-type polysilicon conductive shield is biased with the negative voltage($V_{shd}$) and the bulk silicon is biased with the negative voltage($V_{BB}$) or ground voltage. When the conductive shield 214a is biased with negative voltage, the substrate depletion almost vanishes and the narrow channel effect caused by parasitic gate-to-substrate sidewall capacitance disappears as shown in FIG. 11B(see conventional strong narrow channel effect schematically illustrated in FIG. 11A).

Figure 12:
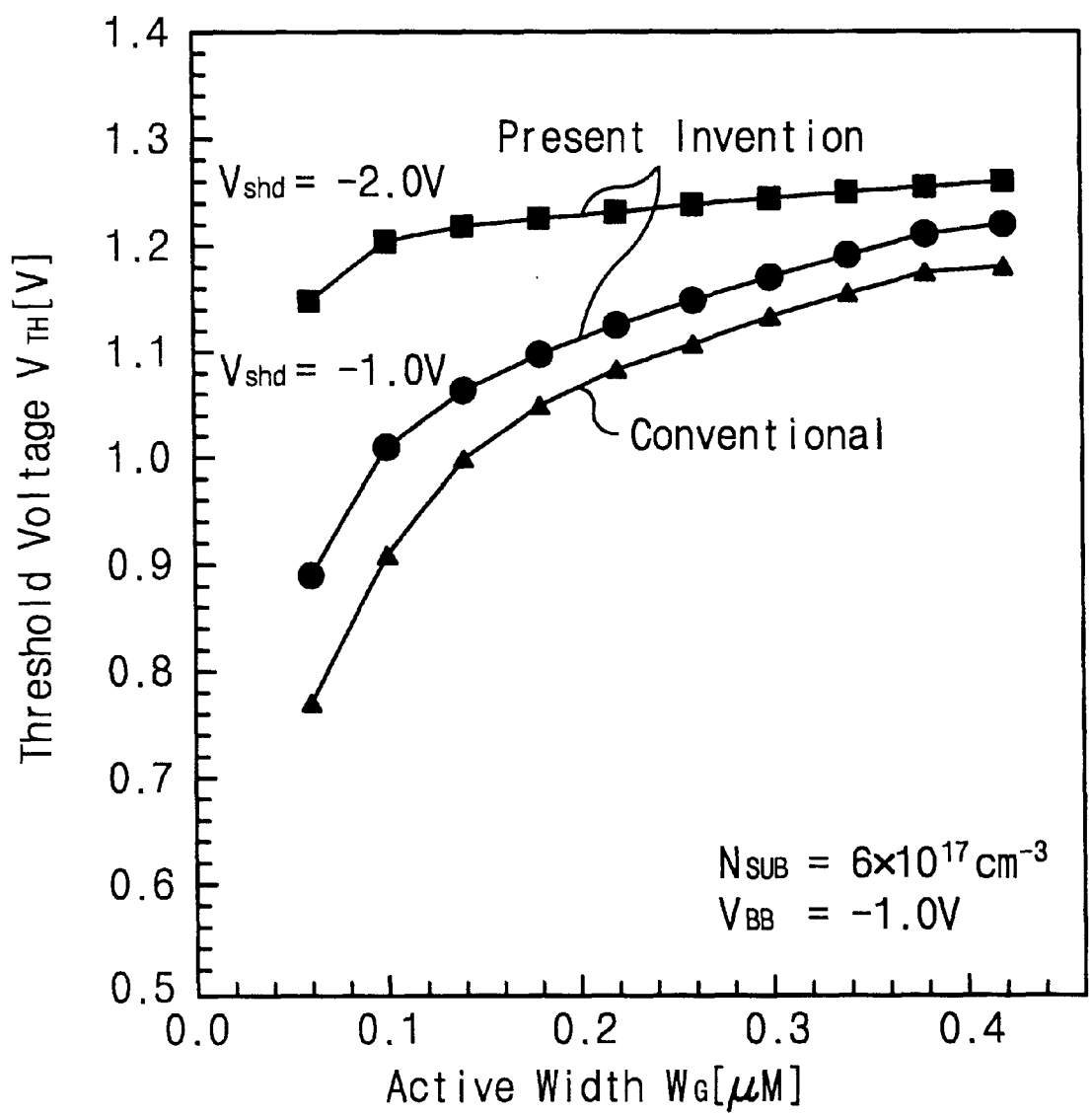
FIG. 12 schematically shows the relationship of threshold voltage variation and active width($W_G$), respectively illustrating the present invention with additional $V_{Shd}$(bias supplied to the conductive shield according to the present invention) and the conventional art.

Once the narrow channel effect disappears, the threshold voltage becomes independent of the active width CD variation as shown in FIG. 12, and the substrate doping can be lowered compared to that of the conventional one. For the conventional cell structure with small isolation pitch, high substrate doping should be applied in order to compensate the threshold voltage reduction owing to narrow channel effect. When the substrate doping becomes higher than $1{\sim}2{\times}10^{18} cm^{-3}$, the junction current increases abruptly and it will seriously degrade DRAM data retention performance. So, lowering the substrate doping using the present cell transistor structure will be greatly helpful in improving junction leakage current.

Figure 13:
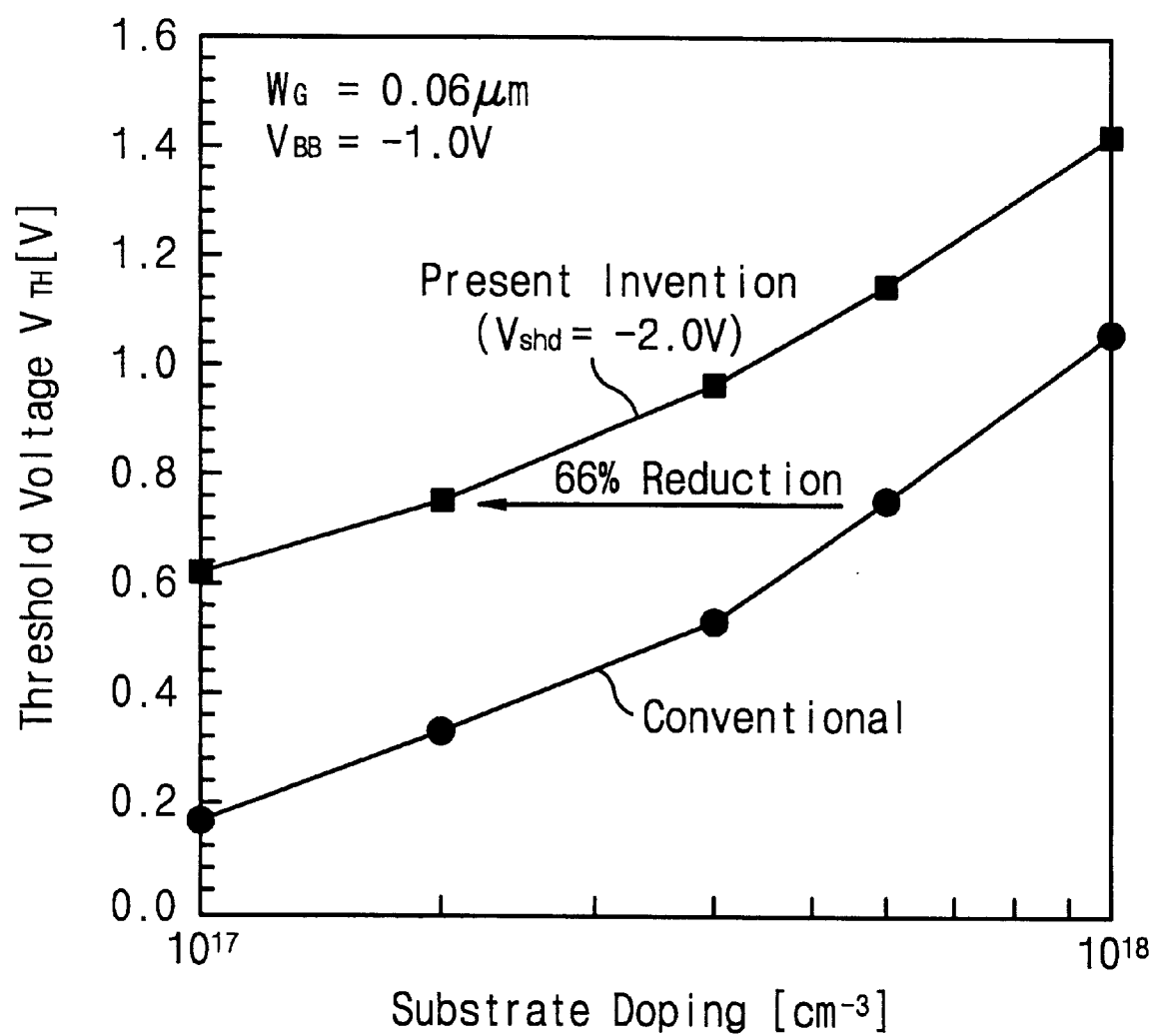
FIG. 13 schematically shows the relationship of threshold voltage variation and substrate doping density, respectively illustrating the present invention with additional $V_{Shd}$(bias supplied to the conductive shield according to the present invention) and the conventional art.
Figure 14:
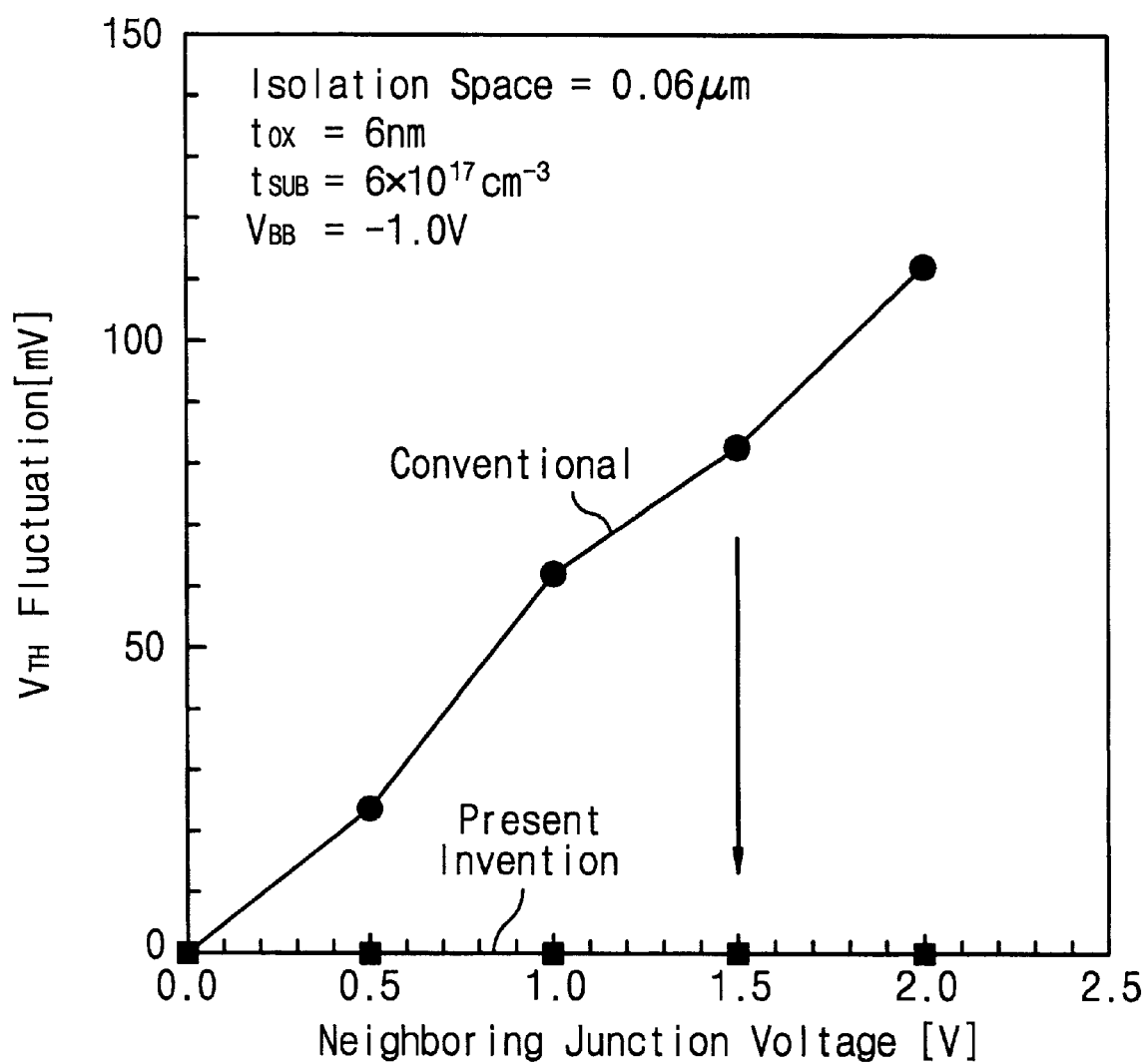
FIG. 14 schematically shows relationship between the threshold voltage variation and the neighbouring drain E-field penetration effect, respectively in the present invention and conventional art.

FIG. 13 shows threshold voltage versus substrate doping of the present and conventional cell transistors for the active width of 0.06 micrometers. The advantage of using the conductive shield become obvious as the active width decreases. FIG. 14 shows the threshold voltage fluctuation caused by the neighbouring drain E-effect penetration of the present and conventional cell transistors. The E-field penetration is fully blocked by the conductive shield so that the present cell transistor structure will be very appropriate for the sub-0.2 micrometers isolation pitch DRAM technology.

Since the threshold voltage can be adjusted by supplying negative potential with the conductive shield in accordance with the present invention, the channel stopping impurity ions implantation can be skipped.

Figure 9A:
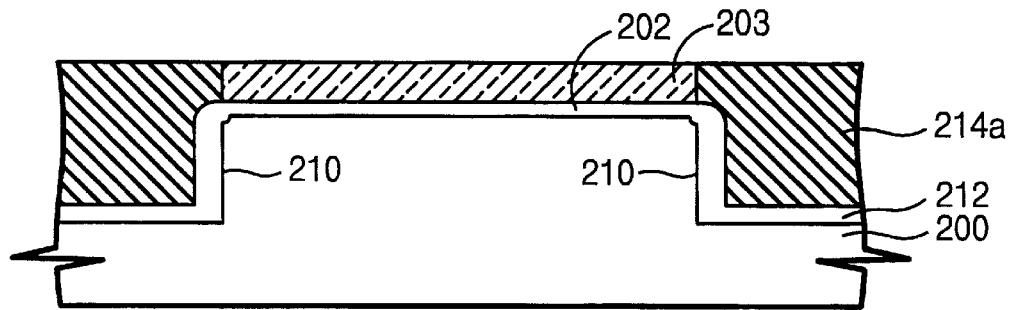
FIGS. 9A to 9E are cross-sectional views taken along line X3–X3' of FIG. 7, at selected process steps of forming a semiconductor memory device according to a second embodiment of the present invention.
Figure 9B:
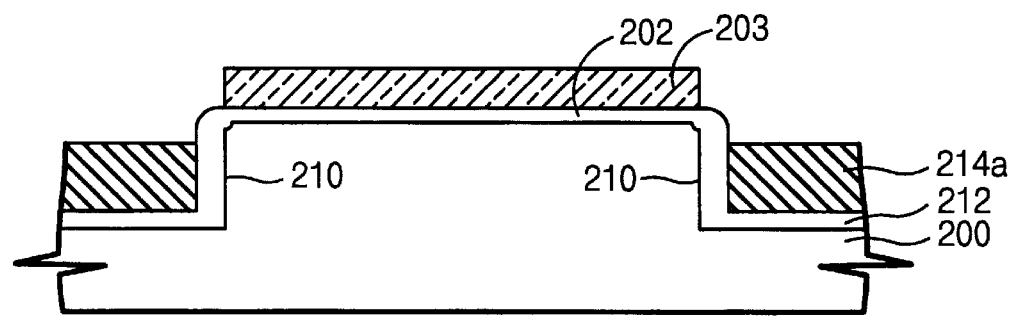
Figure 9C:
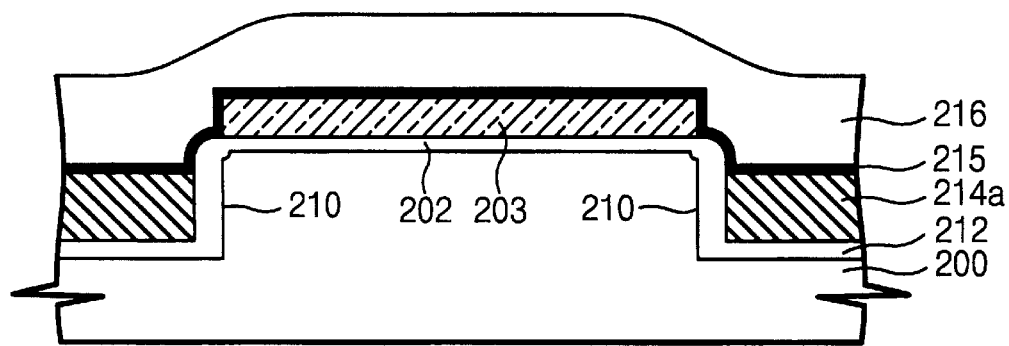

FIGS. 9A to 9E are cross-sectional views taken along line X3–X3' of FIG. 7, at selected process steps of forming a semiconductor memory device according to a second embodiment of the present invention. The same process steps shown in FIGS. 8A to 8J are briefly described for simplicity. In FIGS. 9A to 9E, the same part functioning as shown in FIGS. 8A to 8J are identified with the same reference numbers. The significant difference from the first embodiment is that the formation of a material layer so as to protect the conductive shield. Briefly, after planarizing the conductive material down to a top surface of the silicon nitride layer 203 schematically shown in FIG. 9A, etch back process is carried out on the conductive material to recess at a predetermined depth from a top surface of the substrate of the active region, as shown in FIG. 9B. After that, unlike the first embodiment, a material layer 215 is deposited so as to protect the conductive material 214a. The material layer is made of a material that has an etching selectivity with respect to overlying insulator 216 of oxide. For example, a silicon nitride layer can be employed as such. Next, to complete the trench isolation, the insulator of an oxide 216 is deposited.

Figure 9D:
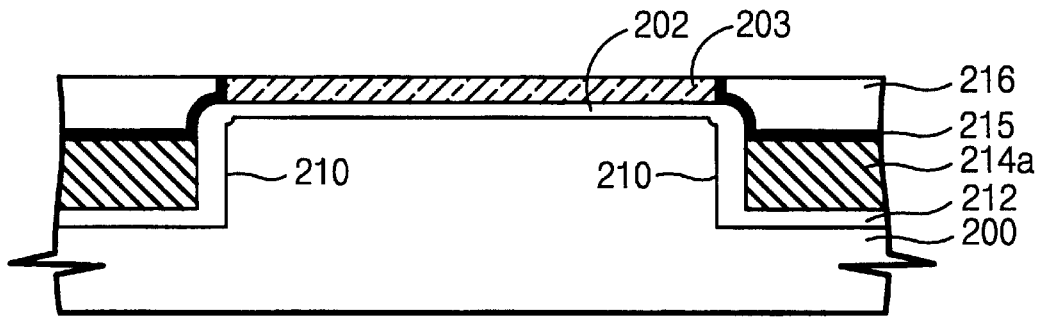
Figure 9E:
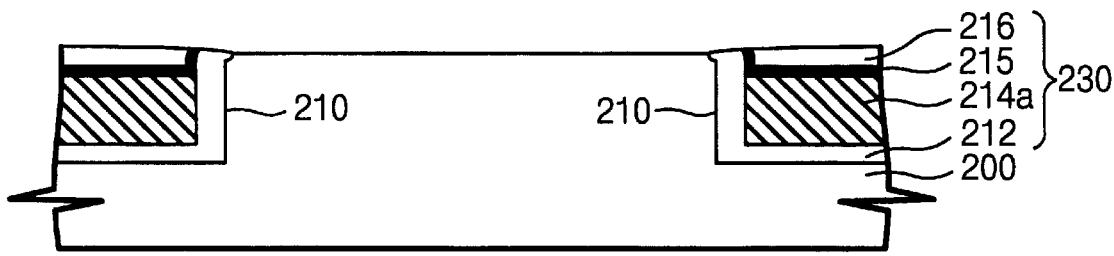

Subsequent process steps are identical to the first embodiment and schematically shown in FIGS. 9D and 9E.

Figure 10A:
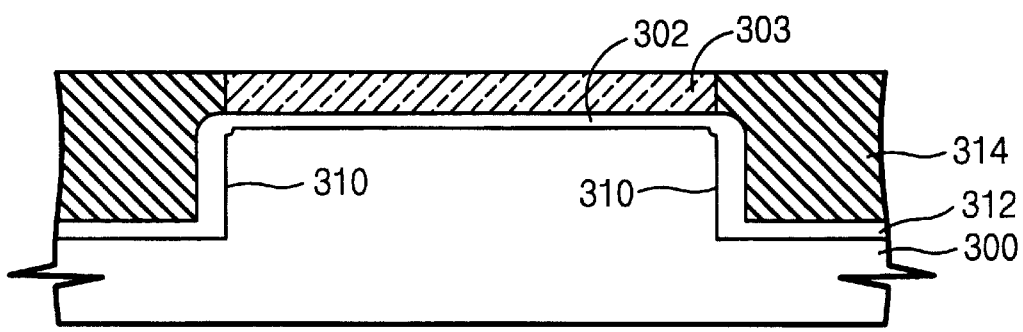
FIGS. 10A to 10D are cross-sectional views taken along line X3–X3' of FIG. 7, at selected process steps of forming a semiconductor memory device according to a third embodiment of the present invention.
Figure 10B:
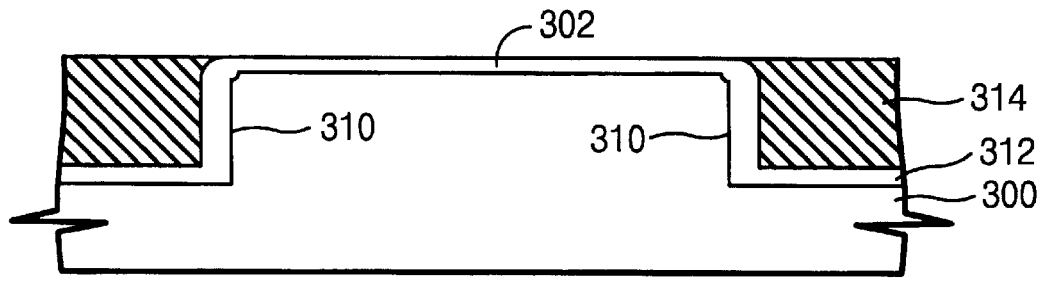
Figure 10C:
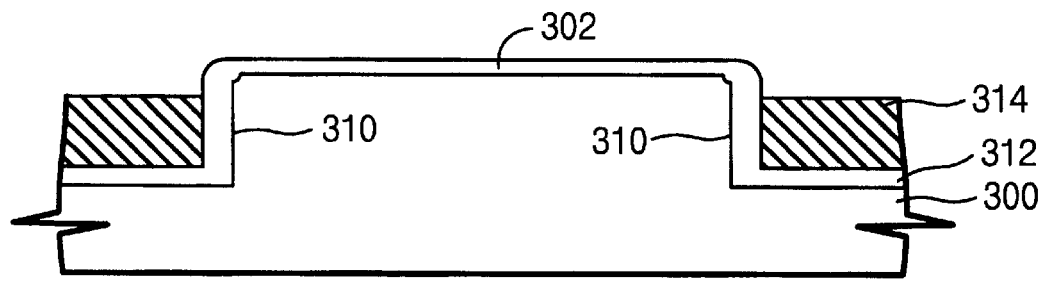

FIGS. 10A to 10D are cross-sectional views taken along line X3–X3' of FIG. 7, at selected process steps of forming a semiconductor memory device according to a third embodiment of the present invention. The same process steps as the first embodiment is omitted for simplicity. FIG. 10A corresponds the same process step as FIG. 8E of the first embodiment. After formation of the semiconductor topology as shown in FIG. 10A through the same process steps as the first embodiment, etch back process is carried out on the silicon nitride layer 303 and the conductive shield 314 using the pad oxide layer 302 as a stopper to form the structure as shown in FIG. 10B. Etch back process further proceeds to recess the conductive shield to a predetermined depth from a top surface of the substrate of an active region as shown in FIG. 10C.

Figure 10D:
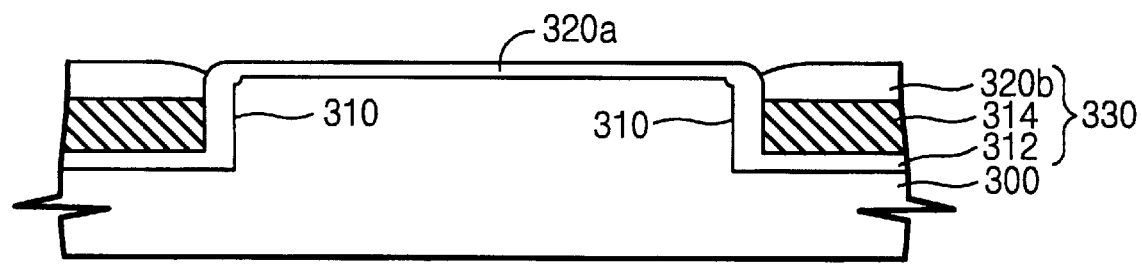

Unlike the first and second embodiments which deposits an oxide insulator, a thermal oxide layer 320a and 320b are grown on the polysilicon shield 314 and the pad oxide 302 to complete trench isolation with embedded polysilicon shield as shown in FIG. 10D. Alternatively, the thermal oxide growth can be preceded by stripping the pad oxide layer.

The DRAM cell structure with conductive shield-embedded shallow trench isolation can fulfill the tight electrical requirements of low junction current by reducing substrate doping and uniform threshold voltage distribution for sub-0.2 mirometers isolation pitch DRAMs and beyond.

What is claimed is:

1. A method of forming an integrated circuit device having a trench isolation region therein, comprising:

forming a trench isolation region in a semiconductor substrate, the trench isolation region having an embedded-conductive shield therein and surrounding a predetermined portion of the semiconductor substrate which comprises an active region;

forming a transistor on the active region;

forming an interlayer insulating layer on the semiconductor substrate; and forming a power supply line that extends on the interlayer insulating layer and is electrically connected to the embedded-conductive shield within the trench isolation region wherein the step of forming the trench isolation region comprises:

etching the semiconductor substrate to form a trench therein having a bottom and sidewalls;

growing a thermal oxide layer on the bottom and sidewalls of the trench:

filling the trench with a conductive material;

etching back the conductive material to define a recess therein;

forming a protection layer comprising a material that has an etching selectivity relative to an insulator material, in the recess; then filling the recess in the conductive material with the insulator material to thereby define an embedded-conductive shield.

2. The method according to claim 1, wherein the power supply line is supplied with a bias of negative voltage or Vss.

3. The method according to claim 1, wherein the conductive material comprises polysilicon, a metal or a metal silicide.

4. The method according to claim 1, wherein the protection layer comprises a nitride layer and the insulator material comprises an oxide.

5. The method according to claim 1, wherein the step of filling the recess comprises depositing an oxide layer of $O_3$-TEOS, SACVD, or HDP into recess.

6. A method of forming a trench isolation region having a conductive shield therein, comprising:

forming a trench in a semiconductor substrate;

lining a bottom and sidewalls of the trench with a first electrically insulating layer; then filling the trench with an electrically conductive material;

etching back the electrically conductive material to define a recess that extends into the trench; then forming a first electrically insulating region in the recess; then forming a second electrically insulating region on the first electrically insulating region, said first electrically insulating region comprising an electrically insulating material that can be selectively etched at a slower rate relative to the second electrically insulating region; and forming an electrode electrically connected to the electrically conductive material in the trench.

* * * * *